(12) United States Patent
Ono et al.

(10) Patent No.: US 6,625,188 B2
(45) Date of Patent: Sep. 23, 2003

(54) OPTICAL SEMICONDUCTOR DEVICE PROVIDED WITH HIGH-NA LENS

(75) Inventors: Miki Ono, Miyagi-ken (JP); Kimihiro Kikuchi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 95 days.

(21) Appl. No.: 09/784,592

(22) Filed: Feb. 15, 2001

(65) Prior Publication Data

US 2001/0030984 A1 Oct. 18, 2001

(30) Foreign Application Priority Data

Feb. 28, 2000 (JP) ........................................ 2000-056013

(51) Int. Cl.[7] .............................. H01S 5/00; G02B 6/36
(52) U.S. Cl. .............................. 372/43; 385/65; 385/73; 385/83
(58) Field of Search .......................... 372/43; 385/88–93, 385/65, 73

(56) References Cited

U.S. PATENT DOCUMENTS

| | | | | |
|---|---|---|---|---|
| 5,555,333 A | * | 9/1996 | Kato | 385/89 |
| 5,706,371 A | * | 1/1998 | Pan | 385/11 |
| 5,852,696 A | * | 12/1998 | Collins et al. | 385/88 |
| 5,966,488 A | * | 10/1999 | Miura et al. | 385/93 |
| 5,991,492 A | * | 11/1999 | Ota et al. | 385/137 |
| 6,172,997 B1 | * | 1/2001 | Miyake et al. | 372/36 |

FOREIGN PATENT DOCUMENTS

JP  11-295561  10/1999

* cited by examiner

*Primary Examiner*—Paul Ip
*Assistant Examiner*—James Menefee
(74) *Attorney, Agent, or Firm*—Brinks Hofer Gilson & Lione

(57) ABSTRACT

An optical semiconductor device to increase optical communication speed has a silicon substrate with an etched V-shaped first groove portion, a light emitting element which has an optical axis in the direction of the first groove portion and is mounted to the upper surface of the silicon substrate, and a high NA aspheric lens is mounted in the first groove portion. The first groove portion is composed of first and second opposing inclined surfaces and a third inclined surface perpendicular to the first and second inclined surfaces. A slit is cut in the silicon substrate extends in a direction perpendicular to the direction of the first groove portion and includes the first, second, and third inclined surfaces. The aspheric lens is mounted to the first and second inclined surfaces and has a part thereof protruding in the slit.

34 Claims, 10 Drawing Sheets

US 6,625,188 B2

OPTICAL SEMICONDUCTOR DEVICE PROVIDED WITH HIGH-NA LENS

BACKGROUND OF THE INVENTION

1. Field of the Invention

The present invention relates to a semiconductor device used in the optical communication field and, in particular, to a semiconductor device provided with a high-NA (numerical aperture) lens in conformity with high-speed/large-capacitance optical communications.

2. Description of the Related Art

As shown in FIG. 7, in a conventional semiconductor device 50, an optical coupling construction is adopted in which light 52 radiated from the end surface of a light emitting element 11 is condensed on an end surface of an optical fiber 14 by using a ball lens 53.

In this semiconductor device 50, a silicon (Si) substrate 55 shown in FIGS. 8A through 8C is used.

In the silicon substrate 55, there is formed in the upper surface portion 55a thereof a V-shaped groove 55b having a substantially V-shaped (trapezoidal) sectional configuration. This V-shaped groove 55b is formed by performing anisotropic etching on the surface of the silicon substrate 55 by using a resist mask formed by photolithography.

And, in the silicon substrate 55, the edge portion connected to the upper surface portion 55a of the V-shaped groove 55b exhibited inclined surfaces 55e, 55f and 55g having peculiar inclination angles due to the silicon crystal structure ($\theta 1$, $\theta 2$ and $\theta 3$, which are all 54.7 degrees).

And, in the silicon substrate 55 of the optical semiconductor device 50 shown in FIG. 8, the positioning of the light emitting element 11 is effected in the upper surface portion 55a near the V-shaped groove 55b, the positioning of the ball lens 53 being effected in the V-shaped groove 55b, the optical axes of the light emitting element 11 and the ball lens 53 coinciding with each other.

However, in the field of optical communications, there is an ever-increasing demand for increasing the communication speed and decreasing the optical coupling loss between the optical semiconductor device 50 constituting the optical coupling of the light emitting element 11 and the optical fiber 14. The optical coupling loss greatly influences the speed of the optical communication and may thus be an obstruction to high-speed optical communication.

In view of this, the present applicant has proposed use of an aspheric lens to decrease the optical coupling loss, instead of the ball lens 53.

As shown in FIGS. 9A and 9B, in the optical semiconductor device 60, instead of the conventional ball lens 53, an aspheric lens 63 is mounted and fixed in the V-shaped groove 55b of the silicon substrate 55.

As shown in FIG. 10, this aspheric lens 63 consists of a limited type lens of an optical glass and comprises a lens main body 63a provided with both-side convex aspheric surfaces, and an edge portion 63b in the peripheral edge of the lens main body 63a, the outer diameter ($\phi$) being 1.0 mm, the lens thickness (tc) being 0.81 mm, the optical length (L=L1+tc+L2) being 3.56 mm, the focal distance (L2) being approximately 2 mm, NA (numerical aperture) being 0.45, the magnification (m) being 3. Further, the distance (L1) from the object point to the apex of the lens surface being 0.3 mm.

Here, the NA can be generally expressed by the following equation.

$$NA = n \sin \theta$$

where $\theta$ is the angle made by the ray having maximum opening of the rays emitted from the object point in the axis and the optical axis; and n is the refractive index of the medium where the object point exists. Thus, the larger the NA, the higher the resolution, making it possible to enhance the efficiency in optical coupling. Further, by making the lens in an aspheric configuration, it is possible to restrain the influence of the aberration.

In this way, in the optical semiconductor device 60 having the aspheric lens whose NA is 0.45, the output light 52 radiated from the end surface of the light emitting element 11 passes the aspheric lens 63 as shown in FIG. 9, and focuses on the end surface of the optical fiber 14 (See FIG. 7). This improvement decreases the loss in optical coupling as compared with the ball lens 53.

Incidentally, in this optical semiconductor device 60, to cope with the increase in speed and capacitance of optical communication and to utilize the characteristics of the aspheric lens to the utmost, it is necessary to further enhance the NA of the lens and reduce the WD (working distance= L1), which is the distance from the light emitting element 11 to the aspheric lens.

In the proposed optical semiconductor device 70 shown in FIG. 12, an aspheric lens 23 having high NA and short WD is mounted on a silicon substrate 55.

As shown in FIG. 11, the aspheric lens 23 consists of an infinite-type lens of optical glass and comprises a lens main body 23a provided with double convex aspheric surfaces and an edge portion 23b in the periphery of the lens main body 23a, the outer diameter ($\phi$) being 1.0 mm, the lens thickness (tc) being 0.81 mm, the focal distance (L2) being infinite, the NA (numerical aperture) being 0.60.

Generally speaking, in an aspheric lens, there is a strict demand for accuracy in optical axis matching as the NA increases. In this aspheric lens 23, the light output from one side becomes parallel rays, so that the optical axis matching can be conducted relatively easily.

However, as shown in FIG. 12, when the aspheric lens 23 having high NA is mounted as it is in the V-shaped groove 55b of the conventional silicon substrate 55 and fixed therein, a portion (H) is generated that interferes with the inclined surface 55g of the V-shaped groove 55b.

Thus, there is a problem that the high NA aspheric lens 23 which utilizes the characteristics of an aspheric lens to the utmost and which has short WD cannot be mounted on the silicon substrate 55.

Further, as shown in FIG. 13, focusing attention on the outer diameter of the aspheric lens 23, it might be possible to prevent the generation of the above-mentioned portion H by reducing the outer diameter ($\phi$). However, from the viewpoint of the intention of maintaining high NA, it is necessary to further reduce the WD. As a result, the size of the aspheric lens 23 is only reduced in geometrical similarity, and, as the size of the lens is reduced, the WD is further shortened, making it impossible to prevent the generation of the portion (H) interfering with the inclined surface 55c.

SUMMARY OF THE INVENTION

It is an object of the present invention to provide an optical semiconductor device of high NA having improved optical communication efficiency that increases the speed and capacitance in optical communication and allows mounting of a short WD lens.

As first means for solving at least one of the above problems, an optical semiconductor device is provided that comprises a semiconductor substrate having on one side an etched and substantially V-shaped first groove portion formed by etching, an optical element having an optical axis in the direction of the first groove portion and mounted to the one side, and a lens mounted in the first groove portion. The first groove portion comprises first and second opposing inclined surfaces and a third inclined surface perpendicular to the first and second inclined surfaces. A second groove portion is formed in the substrate and extends in a direction perpendicular to the direction of the first groove portion. The second groove portion includes the first, second and third inclined surfaces. The lens is mounted to the first and second inclined surfaces and has a part thereof protruding in the second groove portion. The optical element optically communicates through the lens.

Further, in the optical semiconductor device the second groove portion may be formed as a recess extending across the substrate.

Further, in the optical semiconductor device an edge portion of the lens may abut the side wall of the second groove portion.

A second means for solving at least one of the above problems includes a method of increasing coupling efficiency between an optical element, which is disposed on a surface of a silicon substrate, and an optical fiber. The method comprises positioning a lens disposed in an etched and substantially V-shaped first groove portion of the substrate having a first groove direction and having first and second opposing inclined surfaces and a third inclined surface perpendicular to the first and second inclined surfaces such that a part of the lens protrudes in a second groove portion extending in a direction perpendicular to the first groove direction and including the first, second, and third inclined surfaces.

A third means for solving at least one of the above problems includes a method of producing an optical semiconductor device that increases the coupling efficiency between an optical element, which is disposed on a surface of a silicon substrate, and an optical fiber. The method comprises etching first and second opposing inclined surfaces and a third inclined surface perpendicular to the first and second inclined surfaces to form a substantially V-shaped first groove portion in the substrate. The method also comprises forming a second groove portion in the substrate such that the second groove portion extends in a direction perpendicular to a direction of the first groove portion and includes the first, second, and third inclined surfaces.

DESCRIPTION OF THE PREFERRED EMBODIMENTS

Figure 1:
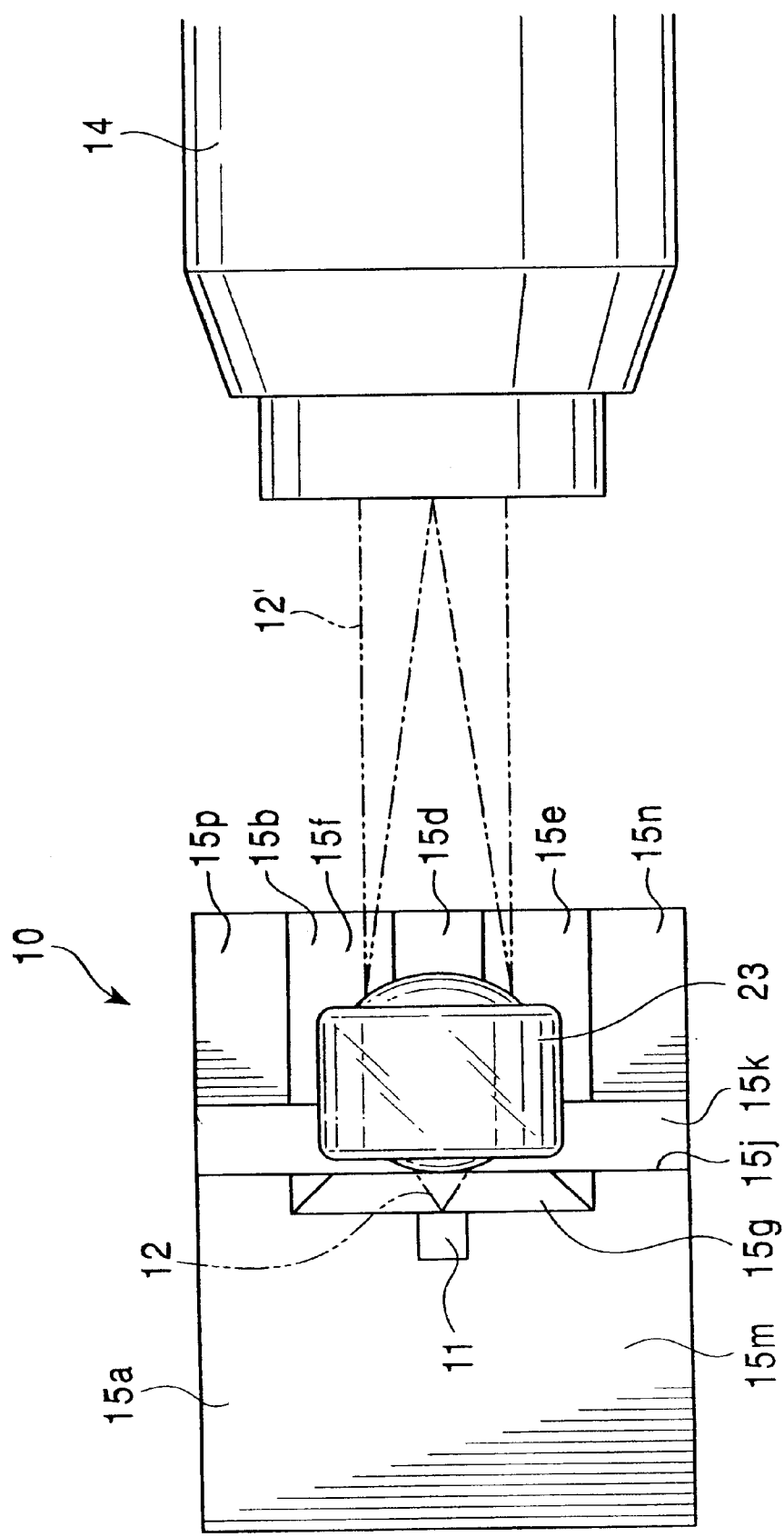
FIG. 1 is an overall view of an optical semiconductor device according to an embodiment of the present invention.
Figure 2:
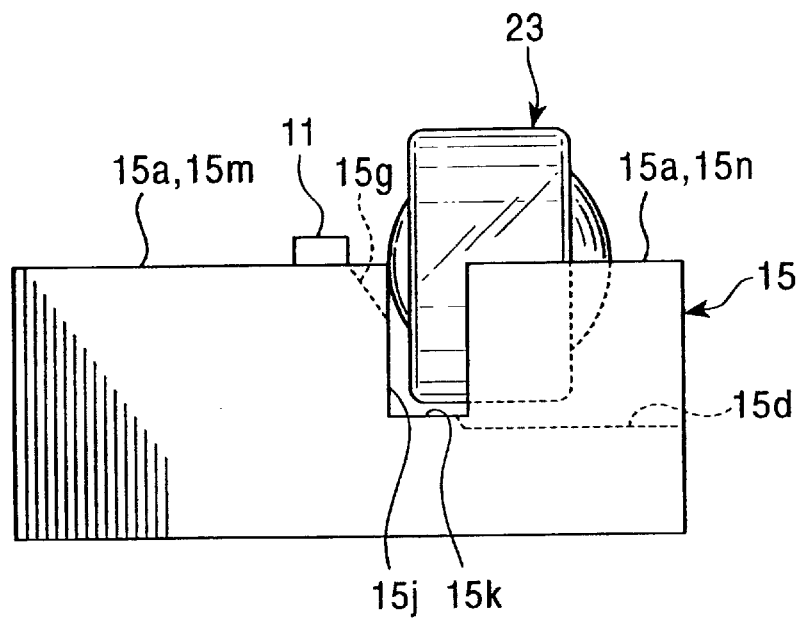
FIG. 2 is a left-hand side view of an optical semiconductor device according to an embodiment of the present invention.
Figure 3:
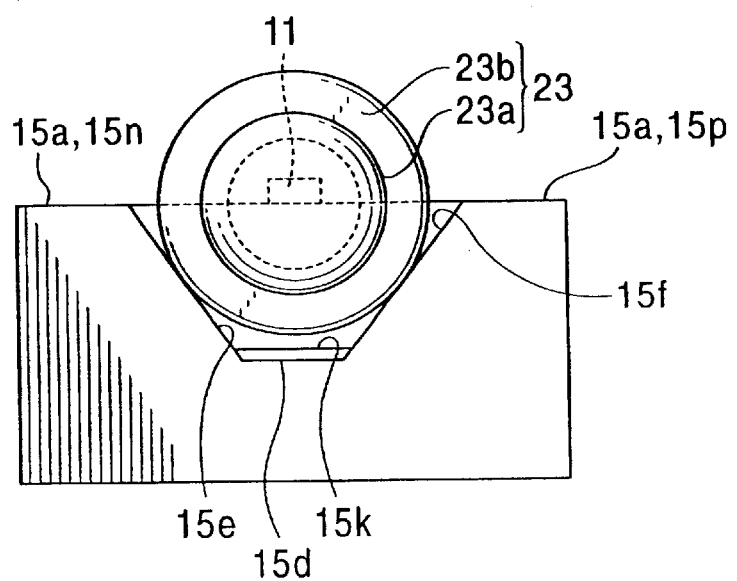
FIG. 3 is a front view as seen from the optical fiber side of an optical semiconductor device according to an embodiment of the present invention.

An optical semiconductor device 10 according to an embodiment of the present invention will now be described with reference to FIGS. 1 through 6.

The portions having the same construction and function as those of the above-described optical semiconductor device will be indicated by the same reference numerals, and a description of such portions will be omitted.

As shown in FIG. 1, the optical semiconductor device 10 is provided with a silicon substrate 15 having a first groove portion 15b of a substantially V-shaped (trapezoidal) configuration formed in the upper surface portion (one side) thereof.

The silicon substrate 15 consists of a silicon (Si) single crystal, and the upper surface portion 15a thereof has a (111) crystal surface, the surface of the first groove portion 15b having a (100) crystal surface.

As shown in FIG. 1 and FIGS. 5A through 5C, the first groove portion 15b comprises a rectangular small bottom surface 15d, a first inclined surface 15e and a second inclined surface 15f surrounding the small bottom surface 15d and opposing to each other, and a third inclined surface 15g perpendicular to the first and second inclined surfaces 15e and 15f. The first through third inclined surfaces 15e, 15f and 15g, which are the (100) crystal surfaces of the first groove portion 15b, are formed by anisotropic etching of the (111) crystal surface of the upper surface portion 15a using a resist mask formed by photolithography.

Thus, the inclination angle made by the small bottom surface 15d and the inclination surfaces 15e, 15f and 15g is a particular inclination angle (θ1, θ2, θ3=54.7 degrees) due to the silicon crystal structure.

Further, the silicon substrate 15 is cut perpendicular to the direction of the first groove portion 15b to form a recessed slit (second groove portion) 15k. The recessed slit 15k includes the first, second and third inclined surfaces 15e, 15f and 15g. A side wall 15j is formed in the recessed slit 15k and is perpendicular to the upper surface portion 15a and the small bottom surface 15d.

Further, due to this slit 15k, the upper surface portion 15a comprises a large first region 15m adjacent to the third inclined surface 15g, and small second and third regions 15n and 15p respectively adjacent to the first and second inclined surfaces 15e and 15f.

As shown in FIG. 1, an optical element, in this case a light emitting element 11 such as a semiconductor laser or the like, is mounted in the first region 15m of the upper surface portion 15a of the silicon substrate 15. This light emitting element 11 is arranged on the first region 15m and close to the edge portion of the third inclined surface 15g, the optical axis of the light 12 emitted from the end surface thereof being in the direction along the first and second inclined surfaces 15e and 15f of the first groove portion 15b.

Figure 4A:
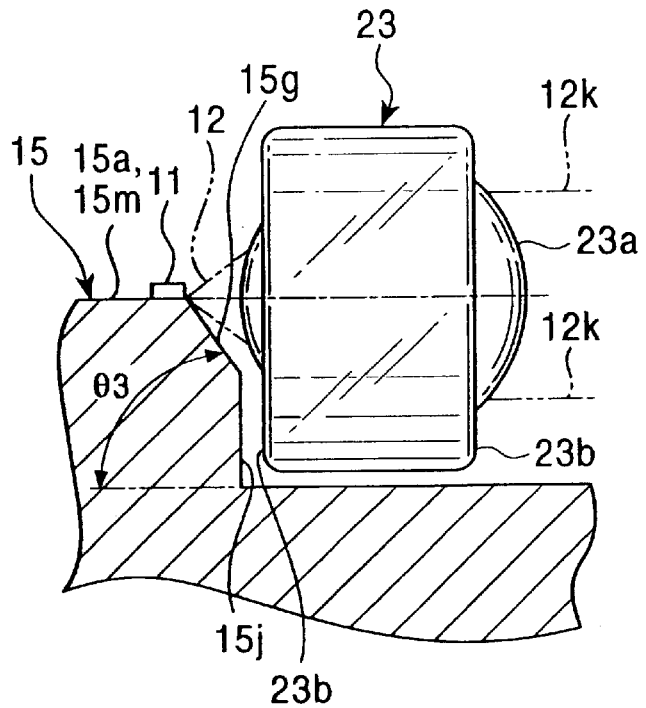
FIG. 4A is a longitudinal sectional view taken along the optical axis direction of an optical semiconductor device according to an embodiment of the present invention.
Figure 4B:
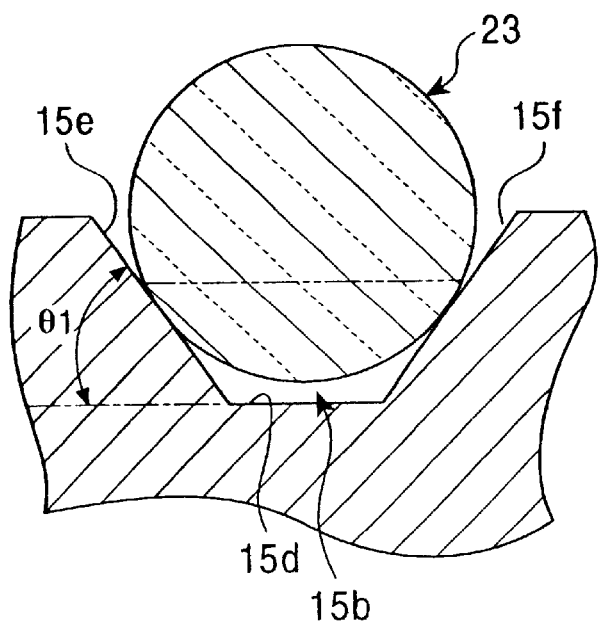
FIG. 4B is a longitudinal sectional view thereof in a direction perpendicular to the optical axis thereof.
Figure 11:
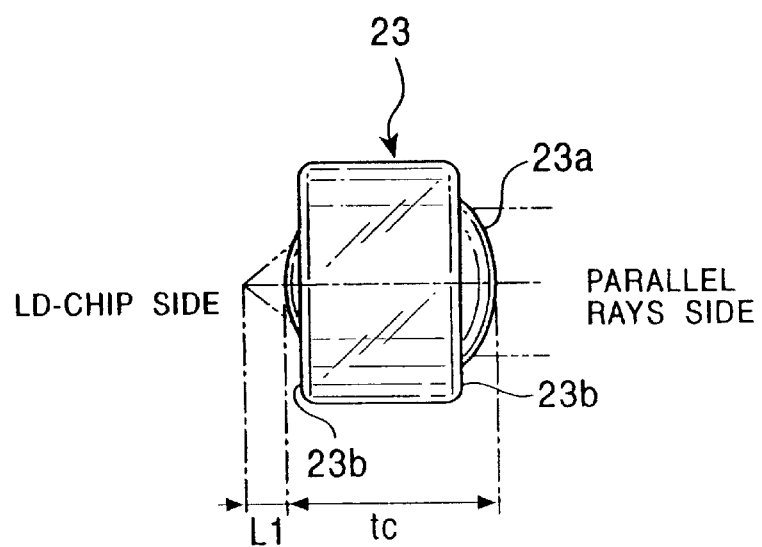
FIG. 11 is an explanatory diagram illustrating a lens optical system having high NA.
Figure 12A:
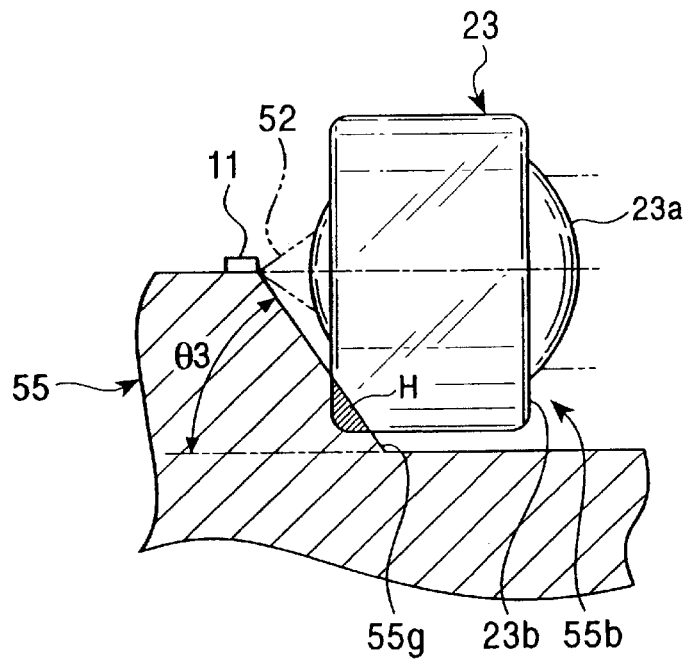
FIG. 12A is a longitudinal sectional view of a proposed optical semiconductor device provided with a high NA lens taken along the optical axis thereof.
Figure 12B:
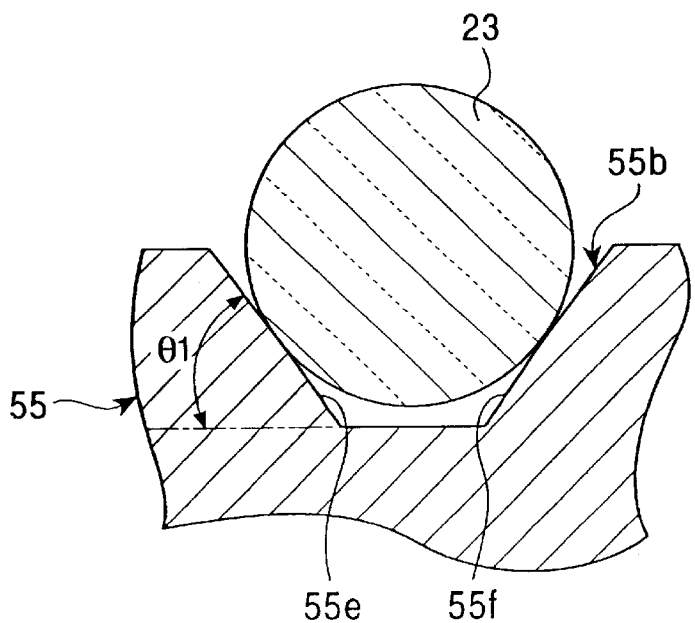
FIG. 12B is a longitudinal sectional view thereof taken in a direction perpendicular to the optical axis thereof.
Figure 13:
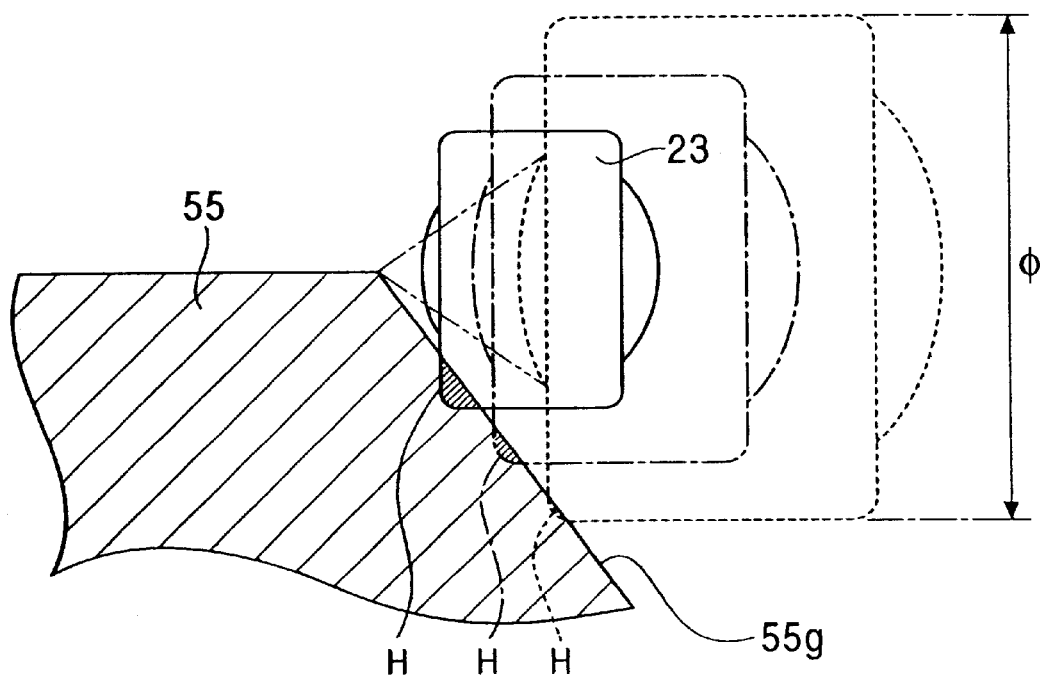
FIG. 13 is a longitudinal sectional view of an optical semiconductor device provided with a conventional lens or a high NA lens taken along the optical axis direction.

Next, as shown in FIGS. 1, 4A and 4B, an aspheric lens 23 (See FIG. 11) of high NA (numeric aperture) is arranged in the first groove portion 15b.

The positioning of the aspheric lens 23 is effected by the first and second inclined surfaces 15e and 15f. The aspheric lens 23 is mounted and fixed such that its optical axis coincides with the optical axis of the light emitting element 11.

Further, in order that the light 12 emitted from the light emitting element 11 is columnated into parallel rays 12' when the light 12 passes through the aspheric lens 23, a portion of the aspheric lens 23 protrudes in the slit 15k. Thus, the aspheric lens 23 is mounted and fixed in the first groove portion 15b and the slit 15k close to the light emitting element 11 side, that is, in a condition in which the working distance (WD) is short, without generating any interfering portion (H). The parallel rays 12' emitted from the aspheric lens 23 impinge upon one end surface of the optical fiber 14.

Next, the method of assembling the optical semiconductor device 10, constructed as described above, will be illustrated.

Figure 5A:
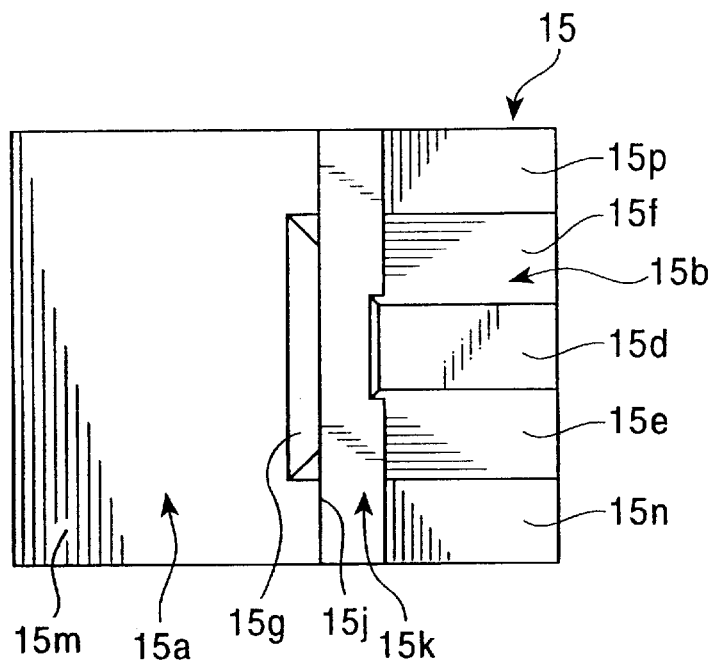
FIG. 5A is a plan view of an optical semiconductor device according to an embodiment of the present invention in a condition in which the lens is not mounted yet.
Figure 5B:
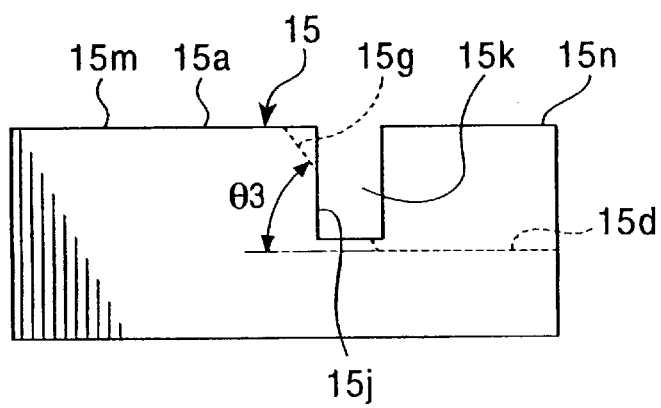
FIG. 5B is a left-hand side view thereof.
Figure 5C:
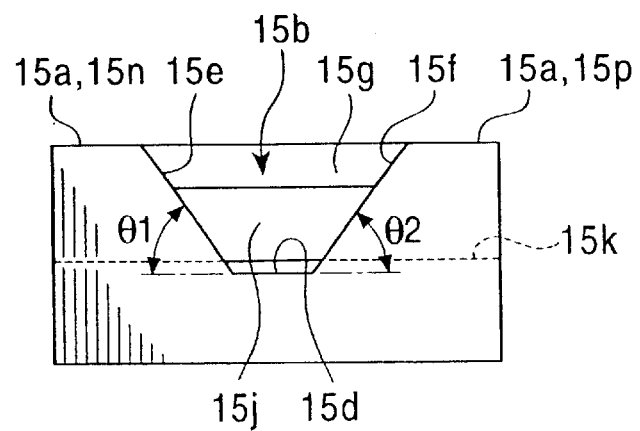
FIG. 5C is a front view thereof.

First, the silicon substrate 15 shown in FIGS. 5A through 5C is prepared. In this silicon substrate 15, anisotropic etching is performed on the upper surface of the substrate consisting of silicon single crystal, thereby forming a substantially V-shaped (trapezoidal) first groove portion 15b. The inclination angle (θ1, θ2, and θ3) of the first through third inclined surfaces 15e, 15f and 15g are all 54.7 degrees.

Then, by using a dicing saw or the like, precision machining is performed on the slit 15k of the silicon substrate 15.

Next, the light emitting element 11 and the high NA aspheric lens 23 are placed on the silicon substrate 15. The light emitting element 11 is accurately optical-axis-adjusted and mounted and fixed to the first region 15m of the upper surface portion 15a by a jig (not shown).

The edge portion 23b of the aspheric lens 23 is positioned in the direction perpendicular to the optical axis by the first and second inclined surfaces 15e and 15f. That is, positioning and adjustment is effected in the horizontal direction (X-axis direction) and the vertical direction (Y-axis direction). Next, along the optical axis direction, the positioning (Z-axis direction) of the aspheric lens 23 is effected by moving it from the first and second inclined surfaces 15e and 15f to the slit 15k and the third inclined surface 15g while effecting optical adjustment, then mounting and fixing the aspheric lens 23 to predetermined positions of the first groove portion 15b and the slit 15k of the silicon substrate 15.

The operation of the optical semiconductor device 10, constructed and assembled as described above, will be illustrated. The light 12 radiated from the end surface of the light emitting element 11 impinges upon a surface of the high NA aspheric lens 23 without being interrupted, and is emitted from the opposing surface of the aspheric lens 23 as parallel rays 12'. The parallel rays 12' then impinge upon one end surface of the optical fiber 14.

Figure 6:
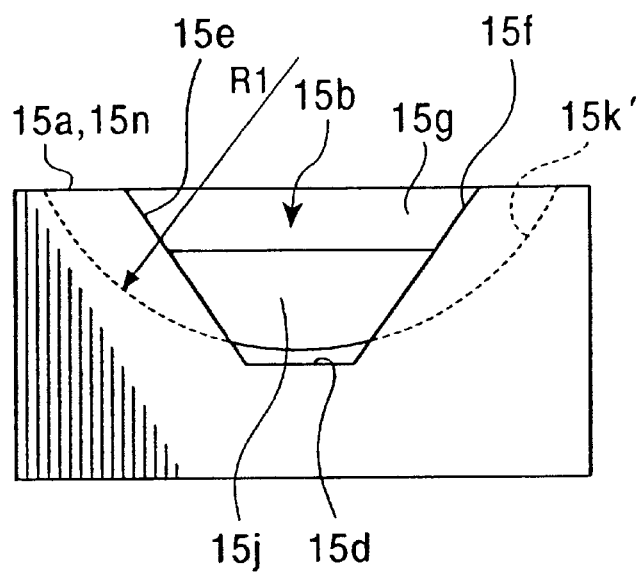
FIG. 6 is a front view showing a modification of the recessed groove of an optical semiconductor device according to an embodiment of the present invention.
Figure 7:
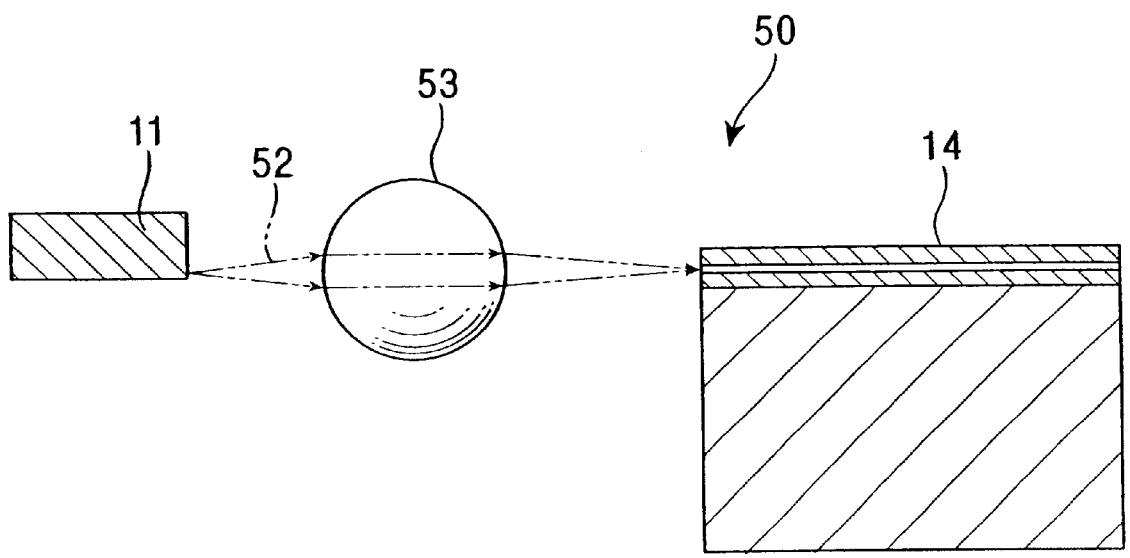
FIG. 7 is a schematic sectional view of a conventional optical semiconductor device.
Figure 8A:
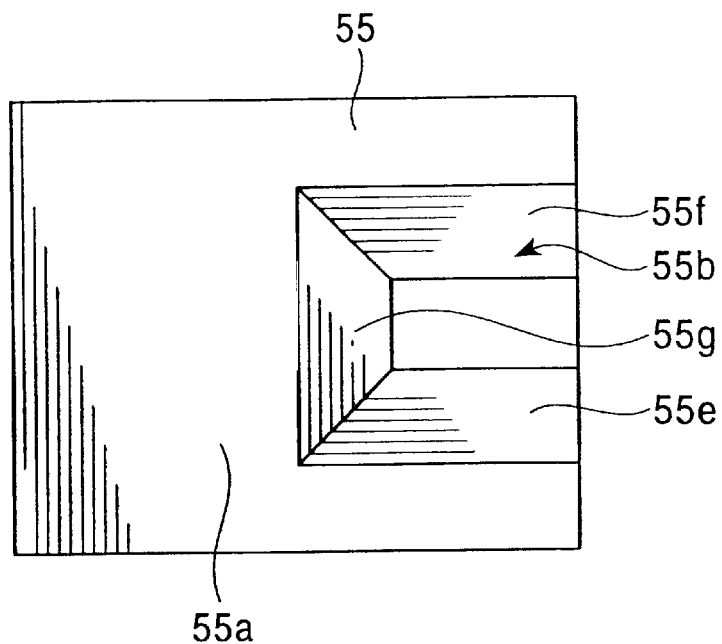
FIG. 8A is a plan view of a silicon substrate used in a conventional optical semiconductor device.
Figure 8B:
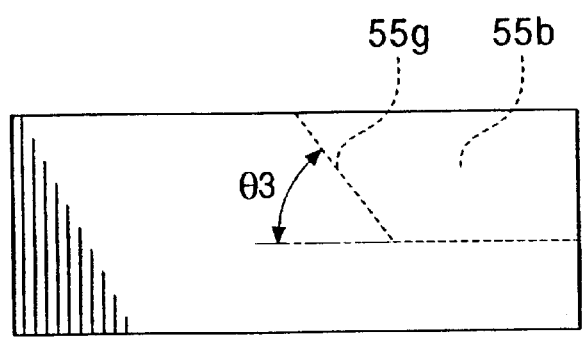
FIG. 8B is a left-hand side view thereof.
Figure 8C:
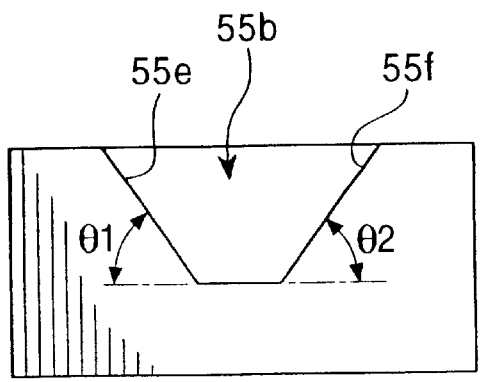
FIG. 8C is a front view thereof.
Figure 9A:
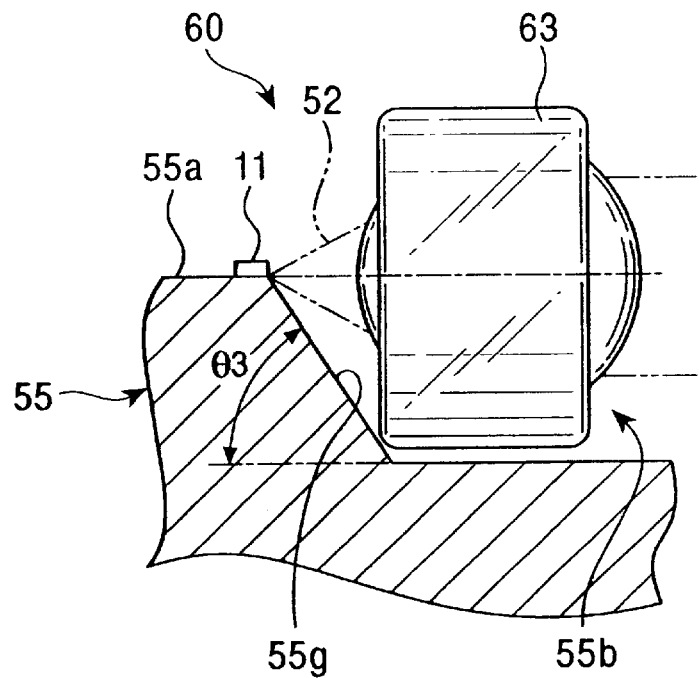
FIG. 9A is a longitudinal sectional view taken along the optical axis direction of a proposed optical semiconductor device.
Figure 9B:
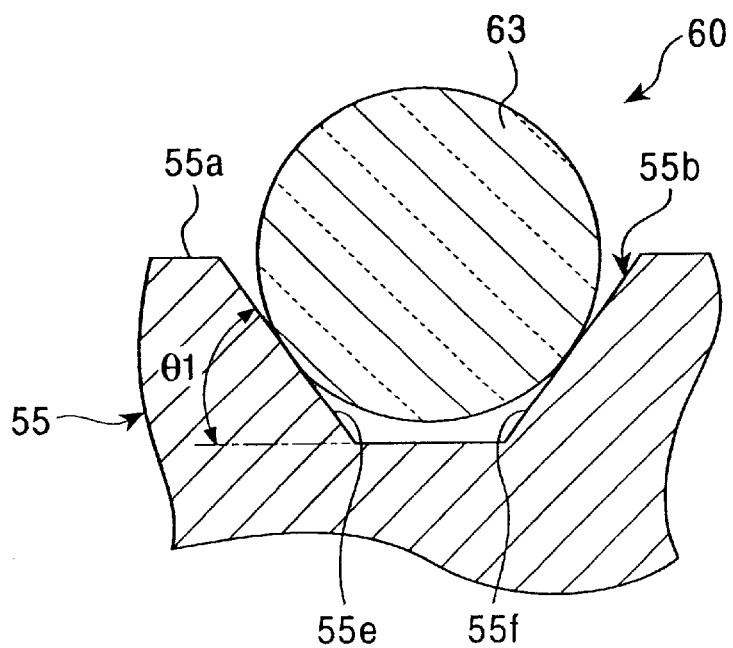
FIG. 9B is a longitudinal sectional view taken in a direction perpendicular to the optical axis thereof.
Figure 10:
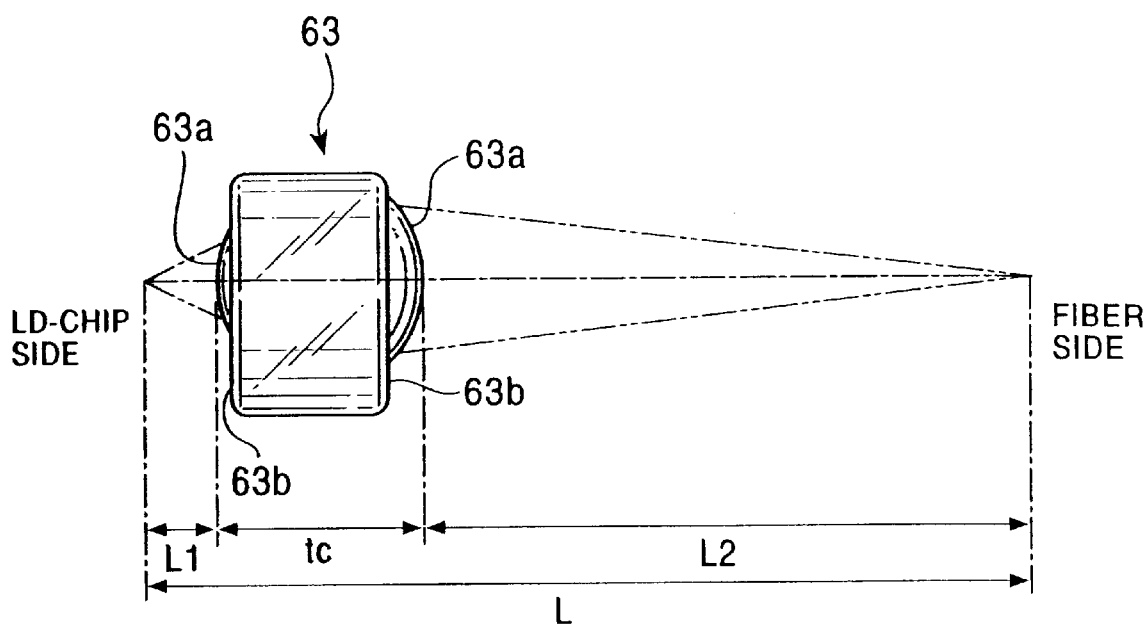
FIG. 10 is an explanatory diagram illustrating a lens optical system used in a proposed optical semiconductor device.

Although the slit 15k in the optical semiconductor device 10 is a recess that extends completely across the silicon substrate 15, if there is no interfering portion (H) in the mounting portion of the aspheric lens 23, there is no need for the slit 15k to extend completely across the silicon substrate 15. For example, the slit may be formed in the configuration shown in FIG. 6. That is, as shown in FIG. 6, the rotation shaft of a rotation member having a radius R1 is secured in position, and the silicon substrate 15 is circularly machined.

The section of the slit 15k' of the silicon 15 formed has a sectional configuration such that it is recessed in the direction perpendicular to the optical axis direction and curved in the optical axis direction. Thus, in the slit 15k', portions of the first, second and third regions 15m, 15n and 15p of the upper surface portion 15a are connected to each other.

While in the optical semiconductor device 10 the high NA aspheric lens 23 is mounted, this should not be construed restrictively. It is also applicable to an aspheric lens of any optical system in which it is necessary to avoid the interfering portion in the prior art. For example, the aspheric lens may be a finite system in which the outer diameter (φ) is 1.0 mm, the lens thickness (tc) is 0.81 mm, the optical length (L) is 3.98 mm, the focal distance (f) is approximately 2.91 mm, the NA (numerical aperture) is 0.5, magnification (m) is 5, and the distance (L1) from the object point to the apex of the lens surface is 0.25 mm.

Further, while the above-described optical semiconductor device 10 is a transmission side optical semiconductor device in which the light emitting element 11 is mounted, it may also be a reception side optical semiconductor device in which a photodetector (optical element) such as a photodiode is incorporated.

Further, the positioning of the optical semiconductor device 10 may be effected by causing the side wall 15j formed by cutting only the part of the third inclined surface 15g of the silicon substrate 15 that opposes the edge portion 23b of the aspheric lens 23.

Note, however, that the optical semiconductor device is not limited to single crystal silicon. Amorphous and polycrystalline silicon as well as various III–V or II–VI semiconductors (GaAs and InP-related or blue laser-type related compounds, for example) may also be used. In addition, the optical element may be grown (or regrown) on the substrate rather than being mounted on the substrate. One example is an edge-emitting laser grown by standard epitaxial techniques and then processed to provide optical semiconductor device having a built-in optical element.

In addition, the second groove may be etched using standard dry, plasma etching processes or substantially isotropic wet etch processes. When using etching processes to form the grooves instead of physically sawing the substrate may necessitate other conventional processing techniques including masking specific areas using photoresist.

The optical semiconductor device 10, constructed as described above, has the following advantages.

1) The slit 15k is formed by cutting the silicon substrate 15 in the direction perpendicular to the direction of the first groove portion 15. The slit 15k includes the first, second and third inclined surfaces 15e, 15f and 15g. The aspheric lens 23 is then mounted to the first and second inclined surfaces 15e and 15f, with a part thereof protruding in the slit 15k, whereby it is possible to mount the high-NA aspheric lens 23 to a desired position in the vicinity of the light emitting element 11. It is thus possible to mount the high-NA, short WD aspheric lens 23 on the silicon substrate 55 and exert the largest possible effect of the aspheric lens 23.

Thus, by use of this optical semiconductor device 10, it is possible to enhance optical coupling leading to the desired result of increasing the speed and capacitance of optical communication.

2) The slit 15k can be easily machined into a recessed configuration by cutting with a dicing saw or the like to cut across the silicon substrate 15, solely moving the cutting edge in one direction (vertical direction).

3) The edge portion 23b of the aspheric lens 23 is mounted to and abuts the side wall 15j of the slit 15k. Positioning in the optical axis direction (Z-axis direction) is possible by using the side wall 15j in addition to the first and second inclined surfaces 15e and 15f, so that the positioning and fixing can be effected more accurately.

As described above, there is provided, in accordance with the present invention, an optical semiconductor device comprising a silicon substrate having on one side a V-shaped first groove portion formed by etching, an optical element having an optical axis in the direction of the first groove portion and mounted to this side, and a lens mounted in the first groove portion. The first groove portion comprises first and second opposing inclined surfaces and a third inclined surface perpendicular to the first and second inclined surfaces. A second groove portion is formed in the silicon substrate that extends in a direction perpendicular to the direction of the first groove portion. The second groove portion is formed by cutting and includes the first, second and third inclined surfaces. The lens is mounted to the first and second inclined surfaces, with a part thereof protruding in the second groove portion. The optical element is capable of optical communication through the lens. The lens is mounted to a desired position in the vicinity of the optical element thereby effecting mounting on the silicon substrate with the lens being of high NA and utilizing the characteristics of the short WD lens.

Thus, by this optical semiconductor device, it is possible to achieve an enhancement in efficiency in optical coupling in conformity with the increase in speed and capacitance in optical communication.

Further, the second groove portion may be formed as a recess extending across the silicon substrate and the machining performed solely by cutting in a single direction, thereby increasing the ease and accuracy of the machining.

Further, an edge portion of the lens may abut the side wall of the second groove portion, allowing accurate positioning and securing of the lens in the optical axis (Z-axis) direction. This also increases the ease of the optical adjustment during mounting of the lens.

What is claimed is:

1. An optical semiconductor device comprising a semiconductor substrate having a surface with an etched and substantially V-shaped first groove portion, an optical element having an optical axis in a direction of the first groove portion and disposed on the surface, and a lens mounted in the first groove portion, wherein the first groove portion comprises first and second opposing inclined surfaces, a bottom surface connecting the first and second inclined surfaces at a bottom of the first groove portion, and a third inclined surface oblique to the bottom surface and connecting the first and second inclined surfaces on an end of the first groove portion, wherein a second groove portion is formed in the substrate that extends in a direction perpendicular to the direction of the first groove portion, the third inclined surface extending from the second groove portion such that the third inclined surface is oblique to the second groove portion, and wherein the lens is positioned on the first and second inclined surfaces, a part of the lens protrudes in the second groove portion, and the optical element optically communicates through the lens.

2. An optical semiconductor device according to claim 1, wherein the second groove portion is a recess extending across the substrate.

3. An optical semiconductor device according to claim 2, wherein the recess extends across an entire region of the substrate that encompasses the optical semiconductor device.

4. An optical semiconductor device according to claim 1, wherein the lens has an edge portion, the second groove portion has a side wall, and the edge portion of the lens abuts the side wall of the second groove portion.

5. An optical semiconductor device according to claim 4, wherein the edge portion of the lens has opposing ends and the second groove portion does not extend significantly further than the opposing ends of the edge portion.

6. An optical semiconductor device according to claim 4, wherein the side wall of the second groove portion is substantially perpendicular to the bottom surface and the third inclined surface extends from the side wall such that the third inclined surface is oblique to the side wall.

7. An optical semiconductor device according to claim 6, wherein the second groove portion contains a bottom surface that is disposed a set distance from the bottom surface of the first groove portion and the third inclined surface extends from the bottom surface of the second groove portion such that the third inclined surface is oblique to the bottom surface of the second groove portion and connects the bottom surface of the second groove portion and the bottom surface of the first groove portion.

8. An optical semiconductor device according to claim 6, wherein the lens contains a lens main body that is encircled by an edge portion.

9. An optical semiconductor device according to claim 1, wherein the optical element is mounted on the surface of the substrate.

10. An optical semiconductor device according to claim 1, wherein the optical element is a light-emitting element.

11. An optical semiconductor device according to claim 10, wherein the light-emitting element is a semiconductor laser.

12. An optical semiconductor device according to claim 11, wherein the light-emitting element is a photodetector.

13. An optical semiconductor device according to claim 12, wherein the photodetector is a photodiode.

14. An optical semiconductor device according to claim 1, wherein the optical element is a light-receiving element.

15. An optical semiconductor device according to claim 1, wherein the second groove portion is a saw cut groove.

16. An optical semiconductor device according to claim 1, wherein the second groove portion is an etched groove.

17. An optical semiconductor device according to claim 1, wherein the second groove portion is a plasma-etched groove.

18. An optical semiconductor device according to claim 1, wherein the second groove portion is a wet chemical-etched groove.

19. An optical semiconductor device according to claim 1, wherein the second groove portion is substantially rectangular shaped.

20. An optical semiconductor device according to claim 1, wherein the second groove portion has a substantially circular shaped, machine cut sectional configuration with a radius set by a rotation shaft of a rotation member.

21. An optical semiconductor device according to claim 1, wherein the lens is an aspheric lens.

22. An optical semiconductor device according to claim 1, wherein the lens has a curved surface and the third inclined surface defines an enclosure that accepts the curved surface of the lens.

23. An optical semiconductor device according to claim 1, wherein the third inclined surface has an upper edge and the optical element is disposed adjacent to the upper edge.

24. An optical semiconductor device according to claim 1, wherein the first groove portion has a first depth, the second groove portion has a second depth, and the first depth is larger than the second depth.

25. An optical semiconductor device according to claim 1, wherein the semiconductor substrate is a silicon substrate.

26. An optical semiconductor device according to claim 1, wherein the semiconductor substrate is a III–V substrate.

27. A method of increasing coupling efficiency between an optical element disposed on a surface of a silicon substrate and an optical fiber, the method comprising positioning a lens disposed in an etched and substantially V-shaped first groove portion of the substrate having a first groove direction and having first and second opposing inclined surfaces, a bottom surface connecting the first and second inclined surfaces at a bottom of the first groove portion, and a third inclined surface oblique to the bottom surface and connecting the first and second inclined surfaces on an end of the first groove portion such that a part of the lens protrudes in a second groove portion extending in a direction perpendicular to the first groove direction and the third inclined surface extends from the second groove portion such that the third inclined surface is oblique to the second groove portion.

28. The method according to claim 27, further comprising positioning an edge portion of the lens to abut a side wall of the second groove portion.

29. The method according to claim 27, further comprising transmitting optical signals between the optical element and the optical fiber.

30. The method according to claim 27, further comprising determining an optimum position of the lens for optical communication between the optical element and the optical fiber.

31. The method according to claim 27, further comprising fixing the optimum position of the lens subsequent to positioning the lens.

32. The method according to claim 31, further comprising transmitting optical signals between the optical element and the optical fiber subsequent to fixing the optimum position of the lens.

33. The method according to claim 27, further comprising fixing a position of the lens subsequent to positioning the lens.

34. The method according to claim 33, further comprising transmitting optical signals between the optical element and the optical fiber subsequent to fixing the position of the lens.

* * * * *